US012757533B2

(12) United States Patent
Moosburger

(10) Patent No.: US 12,757,533 B2
(45) Date of Patent: Oct. 6, 2026

(54) OPTOELECTRONIC COMPONENT HAVING A CARRIER COMPRISING FERROMAGNETIC PARTICLES, AND METHOD OF PRODUCING AN OPTOELECTRONIC COMPONENT COMPRISING HEATING FERROMAGNETIC PARTICLES TO FORM A CARRIER

(71) Applicant: ams-OSRAM International GmbH, Regensburg (DE)

(72) Inventor: Juergen Moosburger, Lappersdorf (DE)

(73) Assignee: ams-OSRAM International GmbH, Regensburg (DE)

( * ) Notice: Subject to any disclaimer, the term of this patent is extended or adjusted under 35 U.S.C. 154(b) by 365 days.

(21) Appl. No.: 18/576,346

(22) PCT Filed: Jul. 11, 2022

(86) PCT No.: PCT/EP2022/069269
§ 371 (c)(1),
(2) Date: Jan. 3, 2024

(87) PCT Pub. No.: WO2023/285355
PCT Pub. Date: Jan. 19, 2023

(65) Prior Publication Data

US 2024/0347676 A1 Oct. 17, 2024

(30) Foreign Application Priority Data

Jul. 14, 2021 (DE) ........................ 102021118151.8

(51) Int. Cl.
*H10H 20/832* (2025.01)
*H10H 20/01* (2025.01)
*H10H 20/831* (2025.01)

(52) U.S. Cl.
CPC ........ *H10H 20/835* (2025.01); *H10H 20/831* (2025.01); *H10H 20/032* (2025.01)

(58) Field of Classification Search
CPC .. H10H 20/835; H10H 20/831; H10H 20/032; H10H 20/854; H10H 20/034;
(Continued)

(56) References Cited

U.S. PATENT DOCUMENTS 6,011,307 A * 1/2000 Jiang .................... H10W 72/20 257/746
6,673,999 B1 * 1/2004 Wang .................... H01F 10/007 174/36
(Continued)

FOREIGN PATENT DOCUMENTS

CN 101783279 A 7/2010
DE 102008021676 A1 10/2009
(Continued)

*Primary Examiner* — Caleb E Henry
(74) *Attorney, Agent, or Firm* — Slater Matsil, LLP

(57) ABSTRACT

In an embodiment a method for producing an optoelectronic component includes providing a semiconductor layer sequence, applying a matrix material comprising ferromagnetic particles, wherein the matrix material is heatable by inductive heating of the ferromagnetic particles, inductively heating the ferromagnetic particles thereby at least partly softening the matrix material and curing the matrix material, wherein the matrix material forms at least part of a carrier.

19 Claims, 4 Drawing Sheets

(58) Field of Classification Search
CPC .... H10H 20/0362; H10H 20/84; H10H 20/01; H10F 71/00; H10F 71/139; H10F 77/306; H10F 77/933
See application file for complete search history.

(56) References Cited

U.S. PATENT DOCUMENTS

| | | | | |
|---|---|---|---|---|
| 6,713,671 | B1 * | 3/2004 | Wang | H01F 10/007 428/218 |
| 8,476,667 | B2 * | 7/2013 | Herrmann | H10H 20/84 438/26 |
| 9,055,655 | B2 * | 6/2015 | Braune | C09K 11/08 |
| 9,640,739 | B2 * | 5/2017 | Bergenek | H10H 20/832 |
| 9,947,843 | B2 * | 4/2018 | Burger | H10H 20/8512 |
| 10,224,467 | B2 * | 3/2019 | Cui | H10H 20/8514 |
| 10,932,399 | B1 * | 2/2021 | Nowak | H05K 9/0083 |
| 11,562,969 | B2 * | 1/2023 | Huang | H10W 42/121 |
| 2004/0211580 | A1 * | 10/2004 | Wang | H05K 9/0075 174/391 |
| 2007/0087564 | A1 * | 4/2007 | Speakman | H01M 10/0436 438/674 |
| 2009/0179214 | A1 | 7/2009 | Xuan et al. | |
| 2010/0244035 | A1 | 9/2010 | Lee et al. | |
| 2010/0244085 | A1 | 9/2010 | Xuan et al. | |
| 2012/0146076 | A1 * | 6/2012 | Braune | C09K 11/08 257/E33.071 |
| 2013/0313591 | A1 | 11/2013 | Shimada et al. | |
| 2015/0091033 | A1 | 4/2015 | Hsing Chen et al. | |
| 2015/0091036 | A1 | 4/2015 | Park et al. | |
| 2015/0214450 | A1 * | 7/2015 | Maute | H10H 20/819 257/98 |
| 2015/0325760 | A1 | 11/2015 | Suenaga et al. | |
| 2017/0077343 | A1 | 3/2017 | Morad et al. | |
| 2017/0077348 | A1 | 3/2017 | Lim et al. | |
| 2019/0139848 | A1 * | 5/2019 | Abderrazzaq | H05K 1/185 |
| 2021/0083152 | A1 * | 3/2021 | Biebersdorf | H10H 20/852 |

FOREIGN PATENT DOCUMENTS

| | | | |
|---|---|---|---|
| DE | 102010006072 | A1 | 8/2011 |
| DE | 102012209513 | A1 | 12/2013 |
| JP | 2013247243 | A | 12/2013 |
| KR | 101290507 | B1 | 7/2013 |
| TW | 201222373 | A | 6/2012 |
| TW | 201222876 | A | 6/2012 |

* cited by examiner

OPTOELECTRONIC COMPONENT HAVING A CARRIER COMPRISING FERROMAGNETIC PARTICLES, AND METHOD OF PRODUCING AN OPTOELECTRONIC COMPONENT COMPRISING HEATING FERROMAGNETIC PARTICLES TO FORM A CARRIER

CROSS-REFERENCE TO RELATED APPLICATIONS

This patent application is a national phase filing under section 371 of PCT/EP2022/069269, filed Jul. 11, 2022, which claims the priority of German patent application 10 2021 118 151.8, filed Jul. 14, 2021, each of which is incorporated herein by reference in its entirety.

TECHNICAL FIELD

A process for producing an optoelectronic component is specified. An optoelectronic component is additionally specified.

SUMMARY

Embodiments provide a process for producing an optoelectronic component in which damage owing to thermal overload is reduced. Further embodiments provide an optoelectronic component which is produced by such a process.

A process for producing an optoelectronic component is specified. For example, the optoelectronic component is a radiation-emitting component. However, it is also possible that the optoelectronic component is set up to detect electromagnetic radiation. In particular, the optoelectronic component is a thin-film chip.

In at least one embodiment, the process comprises a step in which a semiconductor layer sequence is provided. In particular, the semiconductor layer sequence has an active region set up to generate or detect electromagnetic radiation. The semiconductor layer sequence may also be generated by an epitaxial growth method. In other words, for example, the semiconductor layer sequence is an epitaxial semiconductor layer sequence.

In at least one embodiment, the process comprises a further step in which a matrix material is applied. The matrix material comprises ferromagnetic particles. In addition, it is possible to heat the matrix material by inductive heating by means of the ferromagnetic particles. In other words, the matrix material can be heated indirectly by the ferromagnetic particles. The ferromagnetic particles are preferably distributed homogeneously throughout the matrix material. In other words, the ferromagnetic particles have a uniform concentration throughout the matrix material. A homogeneous distribution of the ferromagnetic particles across the matrix material ensures that the matrix material can be heated uniformly. In particular, the matrix material is electrically insulating.

In at least one embodiment, in a further step of the process, the ferromagnetic particles are heated by induction, which at least partly softens the matrix material. The ferromagnetic particles thus transmit thermal energy generated by induction to the matrix material surrounding the ferromagnetic particles. In this way, the matrix material is also heated, as a result of which it at least partly softens.

In other words, the viscosity of the matrix material is reduced by indirect heating by means of the ferromagnetic particles.

In the case of inductive heating of the ferromagnetic particles, for example, a coil, for example with an iron core, is brought into the vicinity of the matrix material comprising the ferromagnetic particles. An alternating voltage or an alternating current is applied to the coil, which generates an alternating field in the ferromagnetic particles. The alternating field in the ferromagnetic particles leads to eddy currents and in particular to transmagnetizations. This causes a loss of heat, which leads to heating of the ferromagnetic particles.

In at least one embodiment, in a further step of the process, the matrix material is cured. The cured matrix material here forms at least part of a carrier of the optoelectronic component. In particular, the curing of the matrix material is achieved by cooling, for example to room temperature.

In at least one embodiment, the process for producing an optoelectronic component comprises the following steps:

- providing a semiconductor layer sequence,
- applying a matrix material, wherein the matrix material comprises ferromagnetic particles and wherein the matrix material is heatable by inductive heating by means of the ferromagnetic particles,
- inductively heating the ferromagnetic particles, which at least partly softens the matrix material,
- curing the matrix material, wherein the matrix material forms at least part of a carrier.

In particular, the process steps are executed in the sequence mentioned.

The inductive heating of the ferromagnetic particles and hence of the matrix material as well makes it possible to protect the constituents of the optoelectronic component from thermal overload during the production. This can be explained in that the inductive heating selectively heats the ferromagnetic particles. Unlike in the case of conventional heating methods, heat is introduced only at sites where there are ferromagnetic particles. The heating of the entire optoelectronic component during production is thus avoided.

In at least one embodiment, the matrix material is applied as a suspension. For this purpose, for example, a powder of the matrix material is suspended in a solvent. In particular, water and/or an alcohol are used as solvents. The suspension is applied, for example, by printing methods such as bar coating or screen printing. The solvent is preferably removed prior to the inductive heating of the ferromagnetic particles.

During the inductive heating of the ferromagnetic particles, the matrix material softens because of transfer of heat from the ferromagnetic particles. This binds the individual constituents of the matrix material powder to give a continuous phase. In other words, the inductive heating of the ferromagnetic particles thus leads to formation of a coherent layer from a pulverulent matrix material.

In at least one embodiment, the matrix material is applied as a prefabricated sheet. By virtue of the inductive heating of the ferromagnetic particles, the entire sheet can be softened and hence adapt to any possible unevenness. In particular, the prefabricated sheet has a thickness of at least 50 micrometers, preferably at least 100 micrometers, more preferably at least 150 micrometers. The prefabricated sheet preferably has a thickness of from 100 micrometers to 200 micrometers inclusive.

In at least one embodiment, the semiconductor layer sequence is grown on a growth substrate. The growth substrate is especially at least partly transparent to electromagnetic radiation. For example, the growth substrate comprises sapphire, GaAs or silicon. In particular, the growth substrate is sapphire. The semiconductor layer sequence is preferably deposited epitaxially on the growth substrate. Advantageously, the growth substrate serves to produce the semiconductor layer sequence with a low density of defects.

In at least one embodiment, the growth substrate is at least partly removed after the matrix material has been cured. For example, the growth substrate is at least partly removed by a lift-off method, especially by laser lift-off (LLO). The at least partial removal of the growth substrate advantageously makes it possible for electromagnetic radiation which is generated in the active region of the semiconductor layer sequence to leave the optoelectronic component with low or zero radiation loss. In the case of an optoelectronic component set up to detect electromagnetic radiation, the electromagnetic radiation to be detected is enabled to reach the active region with low or zero radiation losses. In other words, the at least partial removal of the growth substrate prevents absorption of electromagnetic radiation by the growth substrate.

In at least one embodiment, the applying of the matrix material is preceded by applying of a connection structure to the semiconductor layer sequence. In particular, this connection structure comprises a connection layer and connection elements. Preferably, the connection layer and the connection elements include a metal or are formed from a metal. For example, the connection layer includes Ag or is formed from Ag. For example, the connection elements include Ni or Cu or are formed from Ni, Cu or alloys of Ni and/or Cu. In particular, the connection elements are generated by electrodeposition. The connection structure preferably serves for electrical contact connection of the semiconductor layer sequence.

In at least one embodiment, the curing of the matrix material is followed by removal of a portion of the matrix material. In particular, the matrix material is removed by chemical-mechanical polishing (CMP for short). This creates a flat surface of the matrix material and hence of the carrier as well. The removal can likewise serve to expose the connection structure. This means that the matrix material is preferably removed in such a way that the connection structure and the matrix material each have a surface in a common plane. In other words, it is possible that the connection structure and the matrix material terminate flush.

In particular, the removal of the matrix material on the surface of the matrix material leaves traces that are visible in a finished component.

In at least one embodiment, the matrix material comprises an inorganic or organic polymer. In particular, the matrix material consists of an inorganic or organic polymer. For example, the organic polymer is an epoxy resin. In particular, a filler material has been introduced into the organic polymer.

In at least one embodiment, the matrix material comprises a glass. In particular, the matrix material consists of a glass. In particular, the glass is a low-melting glass. Compared to conventional materials for a carrier, especially organic polymers, glass may have higher thermal stability. Furthermore, glass is notable for low gas permeability and high reliability.

In at least one embodiment, the process produces a multitude of optoelectronic components in a cluster. In this way, a large number of optoelectronic components is advantageously produced in an efficient manner.

In at least one embodiment, the removal of the matrix material is followed by singularization of the optoelectronic components produced in a cluster. For example, singularization is affected by laser division methods or mechanical sawing methods.

In at least one embodiment, the curing of the matrix material is followed by heat treatment by inductive heating of the ferromagnetic particles. Heat treatment can be affected in places or throughout the entire matrix material, since a locally limited heat input is achievable by the inductive heating of the ferromagnetic particles.

Heat treatment is understood to mean heating of a matrix material over a prolonged period, for example up to several days. It is possible by the heat treatment to control mechanical stress in the cured matrix material. If the matrix material is cooled down gradually after the heat treatment, it is possible to prevent internal stresses in the matrix material that can adversely affect optical properties of the matrix material. If the matrix material is quenched after heat treatment, a compressive stress is caused in a surface of the matrix material. Compressive stress leads to a matrix material which is less sensitive to mechanical and/or thermal stress.

In addition, an optoelectronic component is specified. The optoelectronic component is preferably producible by the process described here for production of an optoelectronic component. Features and embodiments described in conjunction with the process are therefore also applicable to the optoelectronic component, and vice versa.

In at least one embodiment, the optoelectronic component comprises a semiconductor layer sequence and a carrier. The semiconductor layer sequence is intended to generate or to detect electromagnetic radiation. The carrier has a matrix material containing ferromagnetic particles.

In at least one embodiment, a connection layer is disposed between the semiconductor layer sequence and the carrier. The connection layer serves, for example, for electrical contact connection of the semiconductor layer sequence. The connection layer preferably comprises a metal or consists of a metal. In particular, the connection layer comprises Ag or consists of Ag.

In at least one embodiment, the connection layer is reflective at least in places. The connection layer may also be reflective over its entire area. In particular, the connection layer has a reflectivity of at least 90%, preferably at least 95%, more preferably at least 99%, for the electromagnetic radiation generated in operation of the optoelectronic component. A connection layer which is reflective at least in places makes it possible to increase the efficiency of the optoelectronic component, since radiation losses are reduced.

In at least one embodiment, the optoelectronic component has connection elements for electrical contact connection of the semiconductor layer sequence. The optoelectronic component preferably has two connection elements. The connection elements are especially formed from a metal, for example Ni.

In at least one embodiment, the connection elements extend through the matrix material of the carrier. Such a design of the connection elements enables simple electrical contact connection of the optoelectronic component. An electrical short circuit of the connection elements can be prevented in that the matrix material of the carrier is in particular electrically insulating.

In at least one embodiment, the connection elements and the carrier terminate flush with one another on the side remote from the semiconductor layer sequence. In other words, the connection elements and the carrier each have a surface in a common plane. By means of flush conclusion of the connection elements and the carrier, it is possible to efficiently mount the optoelectronic component on a parent component. In particular, flush conclusion of the connection elements and the carrier is found to be advantageous since a maximum flat surface area results in good mechanical connection to the parent component.

In at least one embodiment, the matrix material comprises a glass or consists of a glass. Advantageously, use of glass as matrix material leads to an optoelectronic component which is effectively protected from outside influences and has high mechanical stability.

In at least one embodiment, the glass has a glass transition temperature $T_g$ of not more than 350° C., preferably of not more than 300° C. In particular, the glass is thus a low-melting glass. A low glass transition temperature can reduce a processing temperature of the glass. This makes it possible to protect further components of the optoelectronic component from thermal overload.

In particular, a reflecting connection layer of Ag is unstable at high temperatures, for example above 350° C., and the reflective connection layer is thus at least partly destroyed. This can adversely affect the reflectivity of the layer. A glass transition temperature of not more than 350° C., preferably not more than 300° C., enables processing of the glass at low temperatures. This makes it possible to protect the reflective connection layer from destruction. In this way, the reflectivity of the reflective connection layer is maintained.

In at least one embodiment, the glass is a tellurite glass, a bismuth glass, a vanadate glass or a mixture of at least two of these glasses. These glasses especially have a low glass transition temperature, such that they are of excellent suitability for the application described here. For example, $TeO_2V_2O_5$ is used as glass. The glass transition temperature of $TeO_2V_2O_5$ is about 280° C., which enables processing at a temperature of 300° C.

In at least one embodiment, the ferromagnetic particles include at least one of the following elements: Fe, Ni, Co. The particles may consist of one of the elements mentioned or a compound with the element. For example, the ferromagnetic particles are formed from an alloy with at least one of the elements.

In at least one embodiment, the ferromagnetic particles have a diameter of from 10 nanometers to 5 micrometers inclusive. The ferromagnetic particles preferably have a diameter of 10 nanometers to 1 micrometer inclusive, preferably 50 nanometers to 500 nanometers inclusive.

In at least one embodiment, the ferromagnetic particles are present in the matrix material in a proportion of not more than 30% by weight, preferably of not more than 20% by weight, more preferably not more than 10% by weight.

The content of ferromagnetic particles in the matrix material and the diameter of the ferromagnetic particles enables effective introduction of heat into the matrix material during the inductive heating of the ferromagnetic particles. The concentration and particle size of the ferromagnetic particles are chosen so as not to result in any short-circuit of the connection elements of the optoelectronic component.

Further advantageous embodiments, configurations and developments of the process for producing an optoelectronic component and of the optoelectronic component will be apparent from the working examples described hereinafter, in conjunction with the figures.

DETAILED DESCRIPTION OF ILLUSTRATIVE EMBODIMENTS

Figure 1A:
FIGS. 1A to 1C shows steps of a process for producing an optoelectronic component in one working example using schematic section diagrams.

Elements that are the same, are of the same type or have the same effect are given the same reference numerals. The figures and the size ratios of the elements shown in the figures to one another should not be considered to be to scale. Instead, individual elements, especially layer thicknesses, may be represented in excessively large size for better representability and/or for better understanding.

As well as the elements shown in the figures, the embodiments may have further elements, for example interlayers, but these are not shown for reasons of clarity.

In a first step of a process for producing an optoelectronic component according to a working example, as shown in conjunction with FIG. 1A, a substrate 1 is provided. In particular, the substrate 1 is a growth substrate for a semiconductor layer sequence 2. For example, the substrate 1 is sapphire.

Figure 1B:

In a further step of the process, a semiconductor layer sequence 2 is applied to the substrate 1 and hence provided. This step is shown in conjunction with FIG. 1B. For example, the semiconductor layer sequence 2 is provided by epitaxial growth on the substrate 1. The semiconductor layer sequence 2 has an active region 3 that can generate or detect electromagnetic radiation.

Figure 1C:
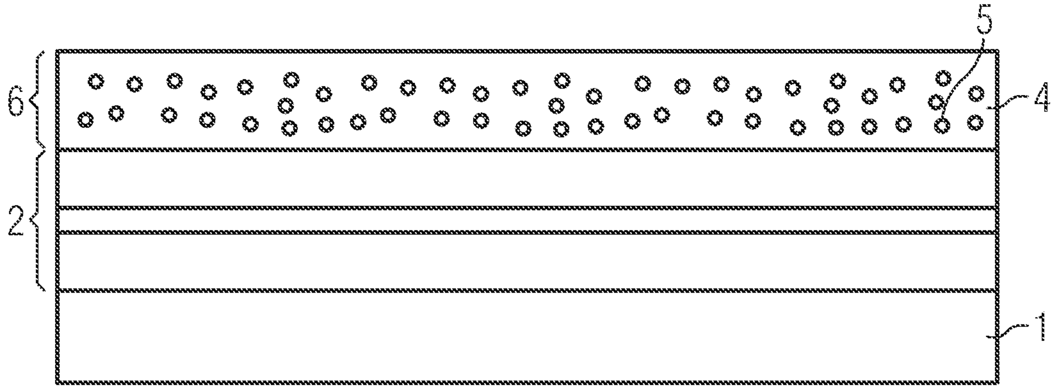

On a side of the semiconductor layer sequence 2 remote from the substrate 1, in a next process step, a matrix material 4 is applied, as shown in FIG. 1C. In particular, the matrix material 4 is a low-melting glass, for example $TeO_2V_2O_5$. The matrix material 4 contains ferromagnetic particles 5 and is heatable by inductive heating by means of the ferromagnetic particles 5. The ferromagnetic particles are, for example, nanoparticles that include Fe or consist of Fe.

Once the matrix material 4 comprising the ferromagnetic particles 5 has been applied to the semiconductor layer sequence 2, the ferromagnetic particles 5 are heated inductively. This at least partly softens the matrix material 4. For the inductive heating, a coil is brought into the vicinity of the matrix material 4 comprising the ferromagnetic particles 5. Applying an alternating current or an alternating voltage generates an alternating field in the ferromagnetic particles 5. The alternating field generates eddy currents in the ferromagnetic particles 5, and transmagnetizations can occur in the ferromagnetic particles 5. This gives rise to a heat loss that leads to heating of the ferromagnetic particles 5.

The ferromagnetic particles 5 heated in this way transmit heat to the surrounding matrix material 4. The ferromagnetic particles 5 thus serve to indirectly heat the matrix material 4. Heating of the matrix material 4 leads to a reduction in viscosity of the matrix material 4. In other words, the matrix material 4 softens.

The inductive heating of the ferromagnetic particles 4 and hence of the matrix material 5 as well is followed by curing of the matrix material 4. In the case of a glass as matrix material 4, the curing is affected by cooling, for example to room temperature. The cured matrix material 4 forms at least part of a carrier 6. The carrier 6 imparts stability to the finished optoelectronic component and enables simple mounting on parent components.

In association with FIGS. 2A to 2E, a process for producing an optoelectronic component is described in a further working example. The optoelectronic components are shown here in a cluster and are singularized after conclusion of all process steps.

Figure 2A:
FIGS. 2A to 2E shows steps of a process for producing an optoelectronic component in a further working example using schematic section diagrams.

FIG. 2A shows that a connection layer 8 is applied on a side of a semiconductor layer sequence 2 which is remote from a substrate 1. The semiconductor layer sequence 2 here, as described in association with FIGS. 1A and 1B, has been grown epitaxially onto the substrate 1.

In particular, the connection layer 8 in FIG. 2A is a metal layer, for example of Ag. The connection layer 8 enables electrical contact connection of the semiconductor layer sequence 2. Moreover, the connection layer 8 may be at least partly reflective to electromagnetic radiation that may be generated or detected in the active region 3 of the semiconductor layer sequence 2. This reduces radiation loss in the finished optoelectronic component.

Figure 2B:
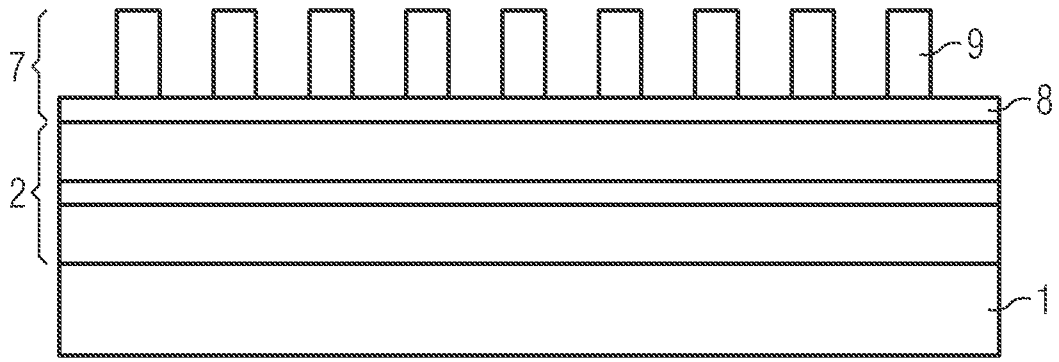

Connection elements 9 are applied to the connection layer 8, as shown in FIG. 2B. The connection layer 8 and the connection elements 9 together form a connection structure 7. The connection elements 9 can be used to connect a finished optoelectronic component, for example electrically, to a printed circuit board. The connection elements 9 are formed from a metal, especially Ni.

Figure 2C:
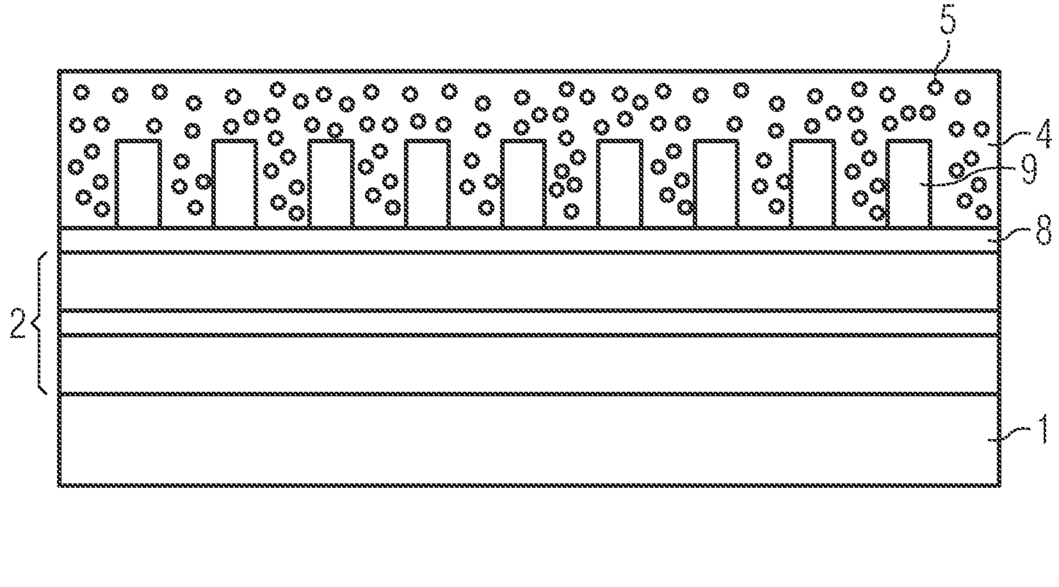

In a further process step shown in FIG. 2C, a matrix material 4 is applied to the connection structure 7 comprising the connection elements 9 and the connection layer 8. Two possible working examples of this process step are described in association with FIGS. 3 and 4.

The matrix material 4 contains ferromagnetic particles 5 and is preferably electrically insulating. In particular, the matrix material 4 is low-melting glass, for example $TeO_2V_2O_5$. The matrix material 4 is applied such that it fully laterally encloses the connection elements 9. In other words, all lateral faces of the connection elements 9 are fully covered by the matrix material 4. The ferromagnetic particles 5 are preferably arranged in the matrix material 4 so as not to result in any electrical short-circuit between two adjacent contact elements 9. A diameter and a concentration of the ferromagnetic particles 5 in the matrix material are chosen accordingly.

In order to achieve complete coverage of the connection elements 9 with the matrix material 4, the matrix material is heated and hence softened by inductive heating of the ferromagnetic particles 5. Subsequently, the matrix material 4 is cured, for example by cooling to room temperature, and thus forms a carrier 6.

In particular, heat treatment of the matrix material 4 can be conducted by reheating by means of inductive heating of the ferromagnetic particles 5. The heat treatment can influence optical and/or mechanical properties of the matrix material 4. For example, the matrix material 4 can be cured by the heat treatment.

Figure 2D:
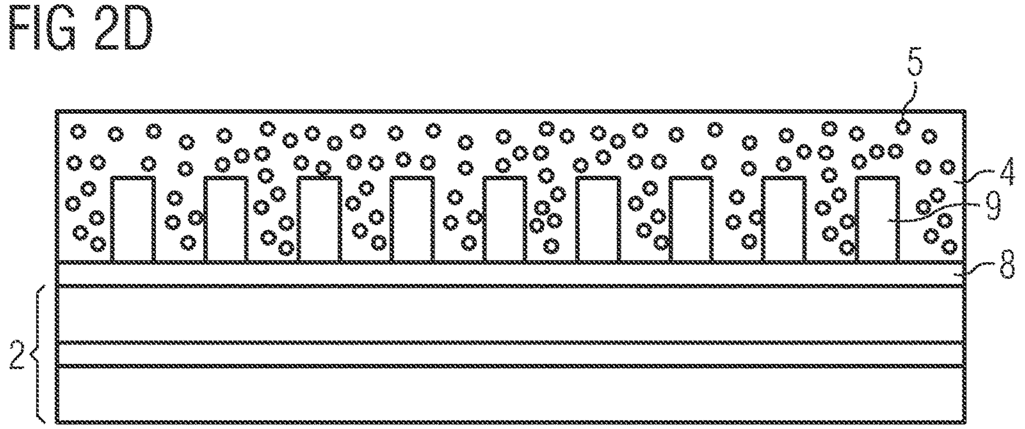

After the curing of the matrix material 4 comprising the ferromagnetic particles 5, as shown in conjunction with FIG. 2D, the substrate 1 is removed by laser lift-off. This avoids or at least reduces radiation losses, for example absorption, caused by the substrate 1, of electromagnetic radiation which is generated or detected in the active region 3 of the semiconductor layer sequence 2.

Figure 2E:
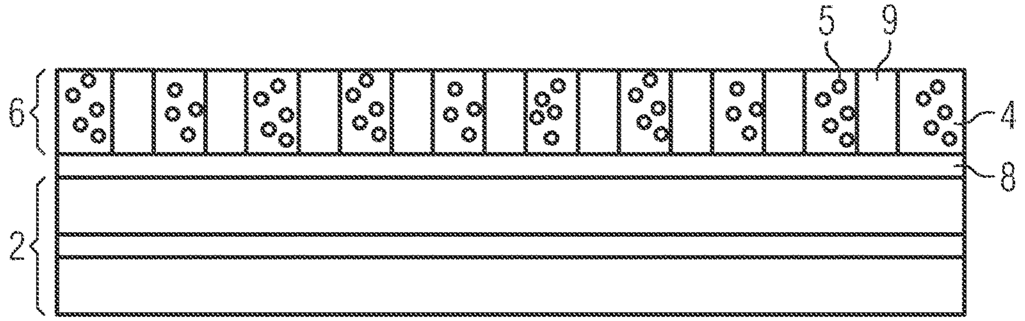

Shown in conjunction with FIG. 2E is a process step in which the matrix material 4 is partly removed. In particular, the matrix material 4 is removed by employing chemical-mechanical polishing. A sufficient amount of matrix material 4 is removed that a surface of the connection elements 9 remote from the semiconductor layer sequence 2 is free of matrix material 4. The connection elements 9 thus extend through the matrix material 4 of the carrier 6 and terminate flush on a side remote from the semiconductor layer sequence 2. In other words, the connection elements 9 are exposed by the removal of the matrix material 4 and can be used for electrical contact connection of the semiconductor layer sequence 2.

For completion of an optoelectronic component, the components produced in a cluster are singularized by a division method.

Figure 3:
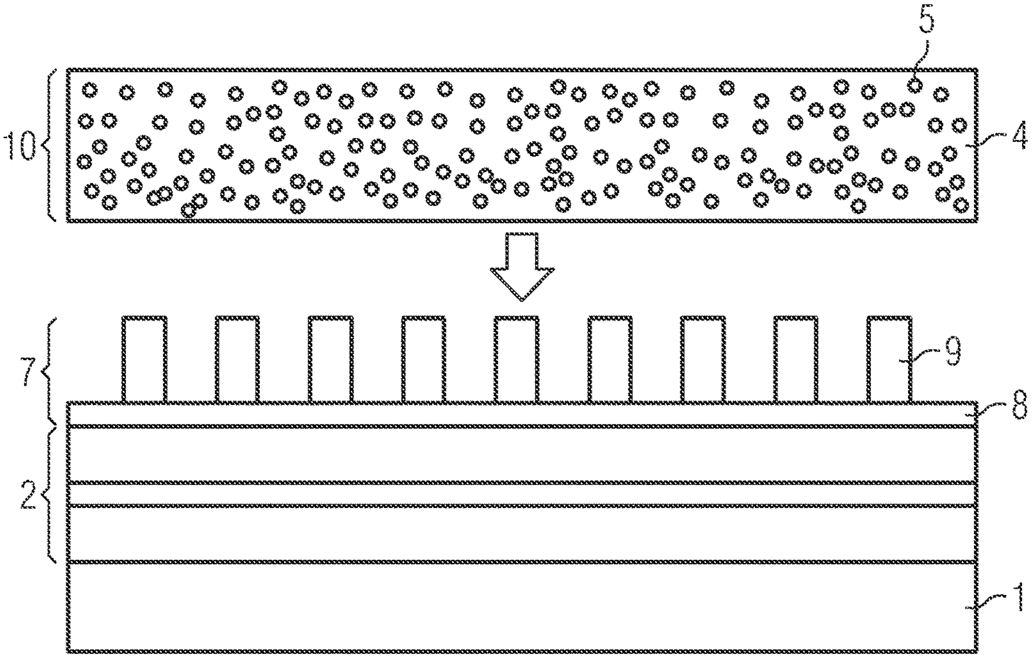
FIGS. 3 and 4 show applying of a matrix material in two working examples, each with reference to a schematic section diagram.
Figure 4:
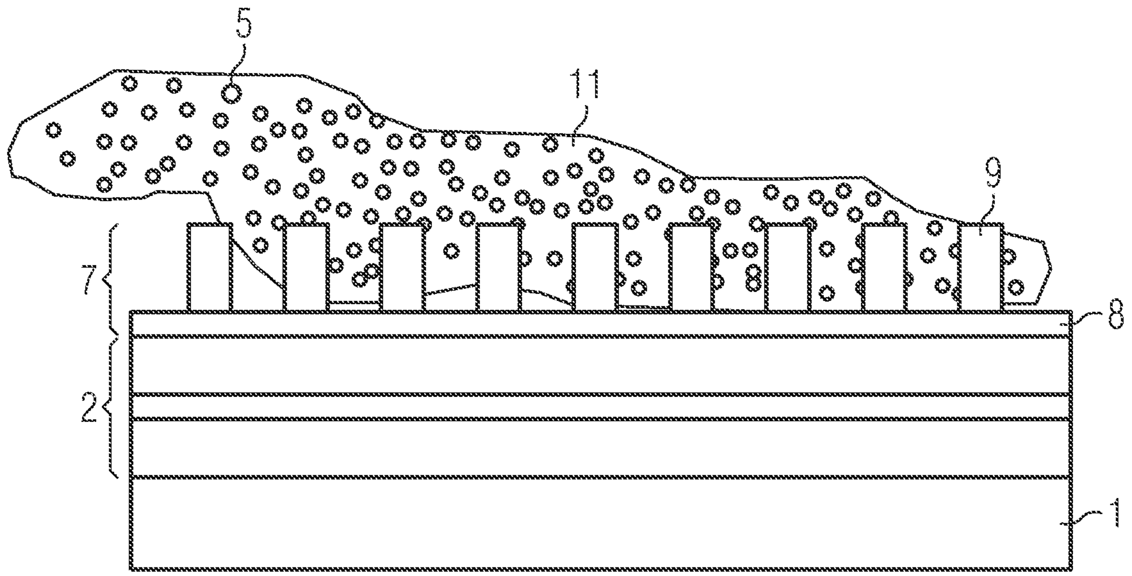

In one embodiment of a process for producing an optoelectronic component, as shown in association with FIG. 3, a matrix material 4 containing ferromagnetic particles 5 is applied as a sheet 10. Inductive heating of the ferromagnetic particles 5 and hence also heating of the matrix material 4 result in softening of the matrix material 4. In other words, the viscosity of the matrix material 4 is reduced. This makes it possible for the matrix material 4 to flow between connection elements 9 applied to a semiconductor layer sequence 2. All exposed surfaces of the connection elements 9 are preferably covered by the matrix material 4. The connection elements 9 and layers beneath may be protected from mechanical stress by the matrix material.

As an alternative to the method of applying the matrix material 4 shown in FIG. 3, the matrix material 4 may be applied as a suspension. Such a course of action is shown in conjunction with FIG. 4. The suspension 11 includes particles of the matrix material 4 and the ferromagnetic particles 5 that are suspended in a solvent. The solvent used is, for example, a mixture of water and an alcohol. In particular, a binder may be added to the suspension 11. The suspension 11 is applied to the connection structure 7 by a printing method, for example bar coating or screen printing. Because of the low viscosity of the suspension 11, the suspension covers the connection structure 7 completely. This means that all surfaces of the connection structure 7 that were exposed prior to the applying of the matrix material 4 are covered by the suspension 11. Before the ferromagnetic particles 5 are inductively heated, which also heats the matrix material 4, the solvent of the suspension 11 is at least partly removed. The connection structure 7 is then surrounded mainly by particles of the matrix material 4 and the ferromagnetic particles 5.

In order that a coherent carrier 6 is formed from the matrix material 4 applied as a suspension 11, the matrix material 4 is heated by means of the ferromagnetic particles 5. The ferromagnetic particles 5 are heated by induction, and transmit their heat to the surrounding matrix material 4. The heating softens the particles of the matrix material 4, and they combine to form a coherent and cohesive layer.

Figure 5:
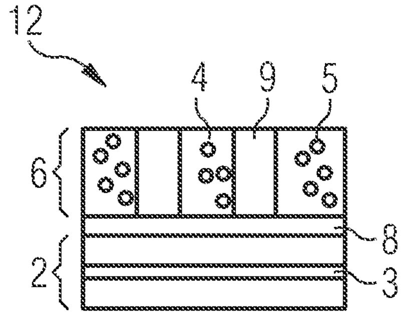
FIG. 5 shows an optoelectronic component in one working example with reference to a schematic section diagram.

FIG. 5 shows an optoelectronic component 12 according to a working example, which is producible by the process described here. The optoelectronic component 12 has a semiconductor layer sequence 2 comprising an active region 3. The active region 3 is set up to generate electromagnetic radiation. The optoelectronic component in this case is a light-emitting diode chip, for example.

A connection layer 8 has been applied atop the semiconductor layer sequence 2. The connection layer 8 is preferably a metal layer which is at least partly reflective. For example, the connection layer 8 includes Ag or is formed from Ag. The connection layer 8 serves to reflect electromagnetic radiation which is generated in the active region 3 and hence to avoid or at least to reduce radiation losses in the optoelectronic component 12. In addition, the semiconductor layer sequence 2 can be electrically contacted via the connection layer 8.

In addition, the optoelectronic component 12 has two connection elements 9 that are set up for electrical contact connection of the semiconductor layer sequence 2. For example, the connection elements are formed from a metal, especially Ni. The two connection elements 9 and the connection layer 8 together form a connection structure 7. The connection elements 9 have been applied on a side of the connection layer 2 remote from the semiconductor layer sequence 2.

For mechanical stabilization, the optoelectronic component 12 also has a carrier 6. The carrier 6 comprises a matrix material 4. The matrix material 4 is electrically insulating. In this way, a short-circuit between the connection elements 9 is prevented. The matrix material 4 is, for example, a low-melting glass, especially $TeO_2V_2O_5$. The use of a low-melting glass as matrix material 4 is preferred since this reduces thermal stress on other elements of the optoelectronic component 12, especially the connection layer 8, in the course of production. By contrast with conventionally used organic polymers, for example an epoxy resin, as matrix material 4, the optoelectronic component 12 is durable at higher temperatures.

The matrix material 4 completely surrounds lateral faces of the connection elements 9. The connection elements 9 extend through the matrix material 4. Surfaces of the connection elements 9 and of the matrix material 4 that are remote from the connection layer 8 terminate flush with one another.

The matrix material 4 contains ferromagnetic particles 5. The ferromagnetic particles 5 can be used to indirectly heat the matrix material 4. The ferromagnetic particles 5 are preferably heated by induction. In particular, the ferromagnetic particles 5 include Fe or are formed from Fe. The ferromagnetic particles are distributed uniformly in the matrix material 4 in order to achieve uniform input of heat into the matrix material 4. For example, the ferromagnetic particles 5 are nanoparticles having a diameter of from 50 nanometers to 500 nanometers inclusive. In order to prevent a short-circuit between the connecting elements 9 by the ferromagnetic particles 5, the proportion of ferromagnetic particles 5 in the matrix material is not more than 40% by weight.

The features and working examples described in conjunction with the figures may be combined with one another in further working examples, even though not all combinations are described explicitly. In addition, the working examples described in conjunction with the figures may alternatively or additionally have further features according to the description in the general part.

The invention is not restricted to the working examples by the description with reference thereto. Instead, the invention encompasses any new feature and any combination of features, which especially includes any combination of features in the claims, even when this feature of this combination itself is not excessively specified in the claims or working examples.

The invention claimed is:

1. A method for producing an optoelectronic component, the method comprising:
   - providing a semiconductor layer sequence;
   - applying a matrix material comprising ferromagnetic particles, wherein the matrix material is heatable by inductive heating of the ferromagnetic particles;
   - inductively heating the ferromagnetic particles thereby at least partly softening the matrix material; and
   - curing the matrix material, wherein the matrix material forms at least part of a carrier.

2. The method according to claim 1, wherein the matrix material is applied as a suspension.

3. The method according to claim 1, wherein the matrix material is applied as a prefabricated sheet.

4. The method according to claim 1, wherein the semiconductor layer sequence is grown on a growth substrate.

5. The method according to claim 4, wherein the growth substrate is at least partly removed after the matrix material has been cured.

6. The method according to claim 1, wherein applying the matrix material is preceded by applying a connection structure comprising a connection layer and connection elements to the semiconductor layer sequence.

7. The method according to claim 1, wherein curing the matrix material is followed by removing a portion of the matrix material.

8. The method according to claim 1, wherein the matrix material comprises a glass or an inorganic or organic polymer.

9. The method according to claim 1, wherein a plurality of optoelectronic components is provided in a cluster.

10. The method according to claim 9, further comprising:
   - removing the matrix material; and
   - thereafter, singularizing the optoelectronic components.

11. An optoelectronic component comprising:
   - a semiconductor layer sequence configured to generate or detect electromagnetic radiation; and
   - a carrier having a matrix material comprising ferromagnetic particles,
   - wherein the matrix material comprises a glass or consists of a glass, and
   - wherein the glass is a tellurite glass, a bismuth glass, a vanadate glass or a mixture of at least two of these glasses.

12. The optoelectronic component according to claim 11, further comprising a connection layer disposed between the semiconductor layer sequence and the carrier.

13. The optoelectronic component according to claim 12, wherein the connection layer is reflective at least in places.

14. The optoelectronic component according to claim 11, further comprising connection elements configured for electrical contact connection of the semiconductor layer sequence.

15. The optoelectronic component according to claim 14, wherein the connection elements extend through the matrix material of the carrier.

16. The optoelectronic component according to claim 14, wherein the connection elements and the carrier terminate flush with one another on their side remote from the semiconductor layer sequence.

17. The optoelectronic component according to claim 11, wherein the glass has a glass transition temperature of not more than 350° C.

18. The optoelectronic component according to claim 11, wherein the ferromagnetic particles include at least one of the following elements: Fe, Ni, or Co.

19. An optoelectronic component comprising:
   - a semiconductor layer sequence configured to generate or detect electromagnetic radiation; and
   - a carrier having a matrix material comprising ferromagnetic particles, wherein the matrix material comprises a glass or consists of a glass.

* * * * *